US006556408B1

(12) United States Patent
Zhang (10) Patent No.: US 6,556,408 B1
(45) Date of Patent: Apr. 29, 2003

(54) COMPENSATION CIRCUIT FOR LEAKAGE THROUGH ELECTROSTATIC DISCHARGE PROTECTION DEVICES

(75) Inventor: Zhengwei Zhang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 83 days.

(21) Appl. No.: 09/630,244

(22) Filed: Jul. 31, 2000

(51) Int. Cl.[7] .................................................. H02H 3/22
(52) U.S. Cl. ........................................ 361/111; 327/198
(58) Field of Search ........................... 361/111; 327/317, 327/198, 143

(56) References Cited

U.S. PATENT DOCUMENTS

| 4,396,883 A | * | 8/1983 | Holloway et al. ............ 323/313 |
| 4,613,772 A | * | 9/1986 | Young ............................ 307/443 |
| 5,220,398 A | * | 6/1993 | Horn et al. ..................... 356/152 |
| 5,659,588 A | * | 8/1997 | Fiedler ............................ 375/376 |
| 5,691,657 A | * | 11/1997 | Hirano et al. .................. 327/94 |
| 5,892,381 A | * | 4/1999 | Koifman ....................... 327/198 |
| 6,242,966 B1 | * | 6/2001 | Shiotsuka ..................... 327/362 |

* cited by examiner

Primary Examiner—Brian Sircus
Assistant Examiner—Zeev Kitov
(74) Attorney, Agent, or Firm—Ronald O. Neerings; Wade James Brady, III; Frederick J. Telecky, Jr.

(57) ABSTRACT

A mixed-signal integrated circuit (12) having compensation for leakage through an ESD cell (16) at an external terminal of a reference voltage is disclosed. A reference voltage generator circuit (14) generates a reference voltage that is low-pass filtered by an on-chip resistor ($R_f$) and an off-chip capacitor ($C_{oc}$). The ESD cell (16) is connected at the terminal node between the resistor ($R_f$) and the capacitor ($C_{oc}$), as is an ESD compensation circuit (20, 20', 20"). The ESD compensation circuit (20, 20', 20") includes a dummy ESD cell (29) that is physically matched to the ESD cell (16), and a current mirror biased in a direction corresponding to the direction of the expected leakage through ESD cell (16). The ESD compensation circuit (20, 20', 20") ensures that very little of the leakage current through ESD cell (16) is conducted by the filter resistor ($R_f$), so that changes in this leakage current over temperature or bias conditions does not modulate the reference voltage.

20 Claims, 3 Drawing Sheets

COMPENSATION CIRCUIT FOR LEAKAGE THROUGH ELECTROSTATIC DISCHARGE PROTECTION DEVICES

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of integrated circuits, and is more specifically directed toward reference voltage generation for mixed-signal integrated circuits.

Modern integrated circuits, as is well known, are fabricated using extremely small circuit elements. These small circuit elements, including both active devices such as transistors and also passive devices such as resistors and capacitors, have been observed to be quite vulnerable to damage from electrostatic discharge (ESD) events at their external terminals. As is well known, many ESD events are caused by a charged human touching a device's external terminal; accordingly, a conventional ESD test generates a charge corresponding to a "human body model". Because of the small feature sizes in modern integrated circuits, a "killing" discharge can be caused by human contact at so low a voltage that the human is unaware of the discharge. Failure mechanisms caused by ESD events include shorted dielectric layers, such as transistor gate oxides, and conductors that are rendered open by excessive current density.

Because of this vulnerability, ESD protection circuits are now commonly implemented in modern integrated circuits. In general, ESD protection circuits are rapidly switching, high current capacity, switches, located in the integrated circuit at a point directly connected to external terminals. These devices are designed to provide a safe shunt for the transient currents of ESD events, sparing the high performance functional circuitry from the ESD energy. Examples of conventional ESD circuits include high threshold voltage transistors, drain extended MOS power transistors (referred to as "DENMOS" devices), thyristors, zener diodes, simple resistors, and combinations of these devices.

As is also well known in the art, the operation of many conventional analog or mixed-signal (i.e., both digital and analog) integrated circuits is based upon one or more reference voltages. Typically, the integrated circuit itself generates a regulated reference voltage based upon an externally applied power supply voltage. For proper operation, particularly in precise applications, the reference voltage must be well-regulated, and stable over variations in temperature, power supply voltage, and the like. Other reference levels can then be generated from this reference voltage.

In addition, as is fundamental in the art, device noise and the noise generated by an integrated circuit during its switching and other high frequency operation can couple to the generated reference voltage. As such, it is desirable to filter the reference voltage with a low-pass filter, preferably having a very low frequency pole (on the order of 10 Hz), so that any high frequency noise coupling to the reference voltage circuitry or output conductor does not affect the reference voltage itself. Such a low-pass filter is commonly implemented by way of a simple R-C network.

Figure 1:
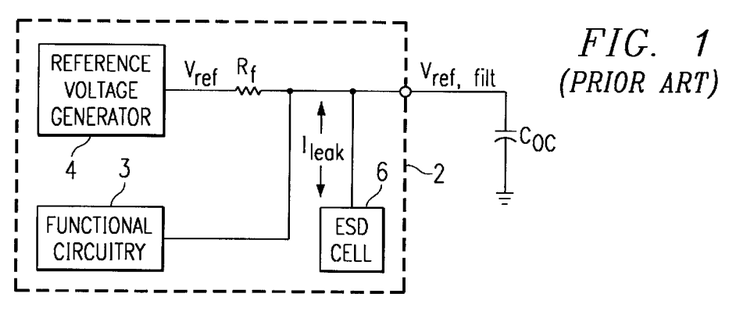
FIG. 1 is an electrical diagram, in block form, of a conventional mixed-signal integrated circuit having a reference voltage generator circuit that is externally filtered.

FIG. 1 illustrates a conventional mixed-signal integrated circuit incorporating a low-pass filter for its reference voltage. In this example, integrated circuit 2 includes reference voltage generation circuit 4, which generates reference voltage $V_{ref}$. In this example, a low-pass filter consists of resistor $R_f$ and capacitor $C_{oc}$, which are connected in series between reference voltage $V_{ref}$ and ground, producing filtered reference voltage $V_{ref,\,filt}$, which is applied to functional circuit 3, which performs the desired digital and analog functions of the device, based upon reference voltage $V_{ref,\,filt}$. The extremely low frequency pole that is desirable for the reference voltage $V_{ref,\,filt}$ requires the time constant corresponding to the product of the values of resistor $R_f$ and capacitor $C_{oc}$ to be quite large. Because of the premium placed upon integrated chip area, however, capacitor $C_{oc}$ cannot be efficiently implemented on-chip. Therefore, as shown in FIG. 1, capacitor $C_{oc}$ is typically implemented externally to the integrated circuit, as indicated in FIG. 1. Resistor $R_f$ is preferably realized within integrated circuit 2, as shown in FIG. 1.

The external implementation of capacitor $C_{oc}$ of course requires an external terminal of integrated circuit 2, to which one plate of capacitor $C_{oc}$ connects. As discussed above, however, each external terminal requires protection from ESD events, even if the terminal fails to carry a signal to any other external device or bus, as in the case of reference voltage $V_{ref}$ in integrated circuit 2 of FIG. 1. Therefore, also as shown in FIG. 1, integrated circuit 2 includes ESD cell 6, which is an ESD protection circuit realized on-chip with integrated circuit 2, at the external terminal of reference voltage $V_{ref,\,filt}$ that is connected to capacitor $C_{oc}$.

As is conventional in the art, ESD cell 6 is the source or sink of a non-zero leakage current $I_{leak}$. Because integrated circuit 2 in this conventional example is a mixed-signal device, including digital circuitry and functionality, ESD cell 6 typically includes some type of MOS transistor, thus presenting a sub-threshold source-drain leakage to reference voltage $V_{ref}$. Leakage current $I_{leak}$ from ESD cell 6 is significantly larger than that presented by analog-only ESD devices. For example, a typical leakage current $I_{leak}$ presented by ESD cell 6 may be on the order of 80 nA.

While this level of leakage is not detrimental to a digital function, or even to a signal input or output, this leakage will cause significant problems when present at the reference voltage $V_{ref}$ terminal of integrated circuit 2. First, because of resistor $R_f$ in the low-pass filter, leakage current $I_{leak}$ will cause a voltage drop $\Delta V$ across resistor $R_f$. In portable applications such as wireless telephone handsets, where external component sizes (such as capacitor $C_{oc}$) are kept to a minimum, resistor $R_f$ will have a relatively large value (e.g., 200 kΩ) to provide the appropriate low-pass performance. As a result, voltage drop $\Delta V$ can be quite sizable, e.g., a 17 mV drop for a 200 kΩ and a 80 nA leakage current. This voltage drop $\Delta V$ is not merely an offset to reference voltage $V_{ref}$, however. Because MOS sub-threshold leakage current $I_{leak}$ is highly temperature sensitive, voltage drop $\Delta V$ will vary significantly with temperature. As such, the voltage $V_{ref,\,filt}$ at the node between resistor $R_f$ and capacitor $C_{oc}$ will be quite uncertain over temperature. Because of the importance of an accurate reference voltage $V_{ref}$ in high-precision analog and mixed-signal circuits, the provision of ESD protection at the reference voltage terminal thus presents a severe limitation on the accuracy and precision of the functional circuitry.

BRIEF SUMMARY OF THE INVENTION

It is therefore an object of the present invention to provide compensation for ESD cell leakage current at a reference voltage terminal of an integrated circuit.

It is a further object of the present invention to provide such compensation in a temperature-stable manner.

It is a further object of the present invention to provide such compensation as suitable for use in mixed-signal circuitry.

It is a further object of the present invention to provide such compensation for leakage current of either polarity.

Other objects and advantages of the present invention will be apparent to those of ordinary skill in the art having reference to the following specification together with its drawings.

The present invention may be implemented into an integrated circuit, such as a mixed-signal device or an analog circuit, having on-chip reference voltage generation capability that utilizes an external filter component for the reference voltage. A compensation circuit is connected in parallel with the ESD cell. The compensation circuit includes a dummy ESD cell that matches the ESD cell, and includes a current mirror that balances the current through the ESD cell and the dummy ESD cell. The compensation circuit also includes a voltage equalizer stage to equalize the node voltages at the current mirror legs, ensuring that the mirror current matches the leakage current of the ESD cell.

DETAILED DESCRIPTION OF THE INVENTION

Figure 2:
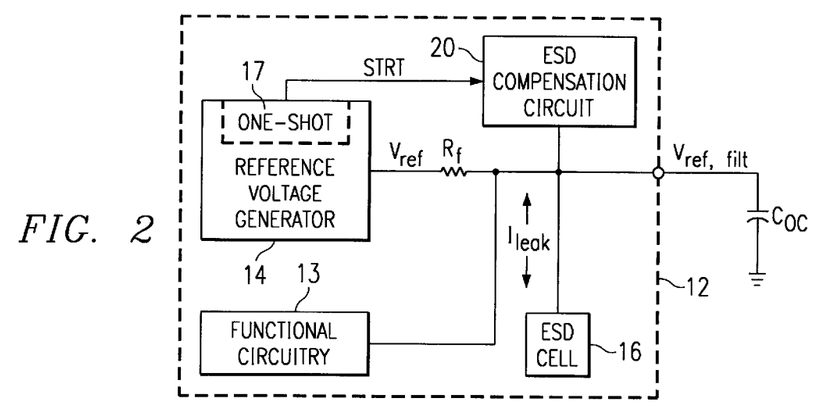
FIG. 2 is an electrical diagram, in block form, of a mixed-signal integrated circuit constructed according to the preferred embodiments of the invention.

Referring now to FIG. 2, the preferred embodiments of the present invention will now be described in connection with the example of integrated circuit 12. It will be apparent from the following description that the present invention is particularly beneficial in connection within mixed-signal devices, namely those performing both analog and digital functions. This particular benefit arises from the sensitivity of analog functions to variations in the reference voltage, in combination with the implementation of electrostatic discharge (ESD) protection circuits according to digital technology. However, those skilled in the art will readily recognize, from this specification, that the present invention may be beneficial in a wide range of applications. Accordingly, it is to be understood that the following description is provided by way of example only.

As Mixed-signal integrated circuit 12 according to this embodiment of the invention includes functional circuitry 13, which includes both analog and digital functions corresponding to the desired functionality of integrated circuit 12 itself. For example, if integrated circuit 12 corresponds to RF interface circuitry in a wireless telephone handset, functional circuitry 13 will correspond to such functions as an analog-to-digital converter (ADC), a digital-to-analog converter (DAC), a coder/decoder circuit (codec), and combinations of these and other conventional functional blocks. In any event, functional circuitry 13 requires a reference voltage for its operation. Accordingly, a reference voltage $V_{ref}$ is generated by reference voltage generator 14 that is realized on the same integrated circuit 12 with functional circuitry 13.

Reference voltage generator 14 may be realized according to any conventional technique. A preferred exemplary realization of reference voltage generator 14 is a bandgap reference circuit, considering the excellent temperature stability of reference voltages generated by these circuits. Other conventional reference voltage generator approaches may alternatively be used in connection with the present invention. In addition, as shown in FIG. 2, one-shot multivibrator 17 is provided within reference voltage generator 14, for producing a startup signal on line STRT upon power-up or reset of integrated circuit 12. The function of the startup signal on line STRT will be described below.

According to the preferred embodiment of the invention, particularly in the case of high precision mixed-signal realizations, reference voltage $V_{ref}$ must be filtered to remove noise resulting from devices in circuitry 14 and the switching operation of functional circuitry 13. In this embodiment of the invention, a low-pass filter having a relatively low frequency pole (e.g., at about 10 Hz) is realized by on-chip resistor $R_f$ in series with off-chip capacitor $C_{oc}$, which is biased to ground. This filter is well-suited for providing the necessary low-pass characteristics for decoupling switching noise from reference voltage $V_{ref}$, and for providing filtered reference voltage $V_{ref,\ filt}$ for use by functional circuitry 13.

The low frequency pole necessitates a relatively large time constant for the low pass filter of resistor $R_f$ and capacitor $C_{co}$. This large time constant, in combination with the premium on integrated circuit chip area, effectively requires capacitor $C_{co}$ to be realized off-chip, as shown in FIG. 2. This, of course, necessitates an external terminal to be provided by integrated circuit 12 for connection to off-chip capacitor $C_{co}$, at node $V_{ref,\ filt}$. Conventional good design techniques require the implementation of an ESD protection circuit at this external terminal at node $V_{ref,\ filt}$, especially considering that this node is connected to functional circuitry 13. According to this preferred embodiment of the invention, ESD cell 16 serves as this ESD protection circuit ESD cell 16 may be realized by any conventional technique, including high threshold voltage transistors, drain extended MOS power transistors (referred to as "DENMOS" devices), thyristors, zener diodes, and resistors, individually or in combination. In mixed-signal devices such as integrated circuit 12, ESD cell 16 will typically be realized by way of digital technology, including metal-oxide-semiconductor (MOS) transistors. As is known in the art, MOS transistors typically involve some small, but detectable, leakage current $I_{leak}$, which may be on the order of 80 nA.

As noted above, in applications such as wireless telephone handsets, it is desirable that the external components such as off-chip capacitor $C_{co}$ be maintained as small as possible, for example on the order of 0.1 μF. To maintain a low frequency pole, this requires on-chip resistor $R_f$ to have a relatively large resistance value, such as 200 kΩ. As discussed above relative to the conventional circuit of FIG. 1, this large resistance value is a problem in the presence of non-temperature compensated leakage current $I_{leak}$. According to the preferred embodiment of the invention, therefore, ESD compensation circuit 20 is provided in integrated circuit 12 of FIG. 2, to compensate for this leakage current $I_{leak}$.

Figure 3:
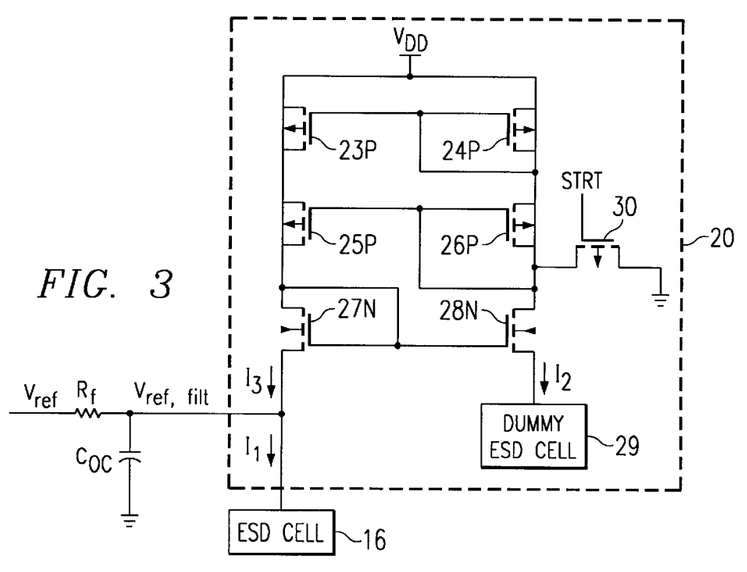
FIG. 3 is an electrical diagram of a leakage compensation circuit according to a first preferred embodiment of the invention.

Referring now to FIG. 3, ESD compensation circuit 20 according to a first embodiment of the present invention will now be described in detail. According to this embodiment of the invention, ESD compensation circuit 20 is provided for the case in which the leakage current $I_{leak}$ is known to be drawn to ground through ESD-cell 16. This situation thus applies for the case in which the reference voltage $V_{ref}$ is relatively high, such as at around 0.5 volts for a power supply voltage $V_{dd}$ ranging from about 1.3 to 1.6 volts. In this example, therefore, a compensation current of the same magnitude will also be generated, in such a manner that the voltage $V_{ref,filt}$ will not respond to changes in $I_{leak}$, such as may occur over temperature.

ESD compensation circuit 20 is arranged as a current mirror, having two legs. One leg of the current mirror is connected to ESD cell 16, and thus assists with the setting of the voltage $V_{ref,filt}$. This first leg includes p-channel MOS transistor 23P having its source at power supply voltage $V_{dd}$, and its drain connected to the source of p-channel MOS transistor 25P. The drain of p-channel MOS transistor 25P is connected to the drain and gate of n-channel MOS transistor 27N, which has its source connected to ESD cell 16 (at the node of $V_{ref,filt}$).

The second leg of the current mirror of ESD compensation circuit 20 includes dummy ESD cell 29. Dummy ESD cell 29 is preferably constructed identically as ESD cell 16, and is preferably located on integrated circuit 12 as close to ESD cell 16 as is physically practicable. The purpose of dummy ESD cell 29 is to provide a leakage current $I_2$ that has matched temperature and bias characteristics with the current $I_1$ drawn by ESD cell 16; the preferred way to accomplish these matching characteristics is to provide dummy ESD cell 29 with virtually the same physical characteristics as ESD cell 16.

The second leg of the current mirror of ESD compensation circuit 20 also includes p-channel MOS transistor 24P which has its source biased to power supply voltage $V_{dd}$, and its gate and drain connected together and to the gate of p-channel MOS transistor 23P in the first leg. P-channel MOS transistor 26P has its source connected to the gate and drain of transistor 24P, and has its gate and drain connected together and to the gate of transistor 25P in the first leg. N-channel MOS transistor 28N has its drain connected to the gate and drain of p-channel transistor 26P, and its gate connected in common with the gate and drain of n-channel transistor 27N; the source of transistor 28N is connected to dummy ESD cell 29 as shown.

For this example, in which dummy ESD cell 29 substantially matches ESD cell 16, the current mirror transistors will match each other, one-to-one. In other words, the device sizes of transistors 23P, 24P will match one another, as will transistors 25P, 26P, and n-channel transistors 27N, 28N. Accordingly, the currents conducted by the two legs of the current mirror of ESD compensation circuit 20 will tend to equalize with one another, in a one-to-one ratio. Alternatively, as is known in the current mirror art, the transistor sizes may be ratioed in the respective legs, so that the conducted currents in the legs are at a selected ratio relative to one another. Because of the matching of dummy ESD cell 29 to ESD cell 16 in this embodiment of the invention, however, the one-to-one current mirror ratio, and thus the one-to-one matching of the corresponding transistors, are preferred.

ESD compensation circuit 20 also includes initialization device 30, which is connected to the node at the gate and drain of p-channel transistor 26P. Initialization device 30 initializes the operation of ESD compensation circuit 20 by effectively grounding this node. In this example, initialization device 30 is a p-channel MOS transistor having its drain biased to ground, and its gate driven by line STRT from one-shot multivibrator 17 in reference voltage generator circuit 14 (FIG. 2).

In operation, ESD compensation circuit 20 by a negative-going pulse online STRT from one-shot multivibrator 17. As noted above, one-shot multivibrator 17 issues this pulse responsive to startup of integrated circuit 12, such as on power-up or reset of the device. This negative pulse turns on initialization device 30, grounding the node at the gate and drain of p-channel transistor 26P to turn it on. This also turns on transistor 24P in the second leg of the current mirror and, because of the common connection of transistors 24P, 26P with transistors 23P, 25P in the first leg of the current mirror, also turns on these transistors 23P, 25P With transistors 23P, 25P both conducting, transistor 27N is turned on by the high voltage (substantially at power supply voltage $V_{dd}$) appearing at its gate and drain. This also turns on n-channel transistor 28N in the second leg of the current mirror. Accordingly, both legs of the current mirror are conducting current from power supply $V_{dd}$ toward ESD cell 16 (current $I_3$) and dummy ESD cell 29 (current $I_2$).

Once the pulse on line STRT ends and initialization device 30 is turned off, the current $I_2$ conducted by p-channel transistors 24P and 26P will tend to match the current $I_3$ conducted by p-channel transistors 23P, 25P, given the transistor matching described above. However, the current $I_2$ in the second leg of the current mirror is governed by the amount of current drawn by dummy ESD cell 29 for the current temperature, bias, and other conditions. Accordingly, the steady-state condition of ESD compensation circuit 20 will be reached, such that currents $I_2$ and $I_3$ are equal.

The operation of n-channel transistors 27N, 28N ensure that the voltage at their respective sources are also equal. This is because of the common gate connection of these two transistors, biased to the drain voltage of transistor 27N. Accordingly, the voltage at the source of transistor 28N will equalize to the voltage $V_{ref,filt}$. Because ESD cell 16 and dummy ESD cell 29 are matched with one another, such that their respective leakage currents $I_1$ and $I_2$ are equal, and because the current mirror legs ensure that currents $I_2$ and $I_3$ are also equal, currents $I_1$ and $I_3$ are equalized by the operation of ESD compensation circuit 20. This ensures that essentially no current is drawn through resistor $R_f$, so that there is no voltage drop across this resistor $R_f$.

Because of the operation of the current mirror of ESD compensation circuit 20, changes in temperature and other conditions that modulate the leakage current through ESD cell 16 will be matched by the current $I_2$ drawn by dummy ESD cell 29. These changes in leakage current will be equalized by the current mirror, such that the voltage $V_{ref,filt}$ will again be equalized, again ensuring that essentially no current is conducted through resistor $R_f$. Filtered reference voltage $V_{ref,filt}$ is thus stabilized over changes in temperature and bias voltage by ESD compensation circuit 20.

Figure 4:
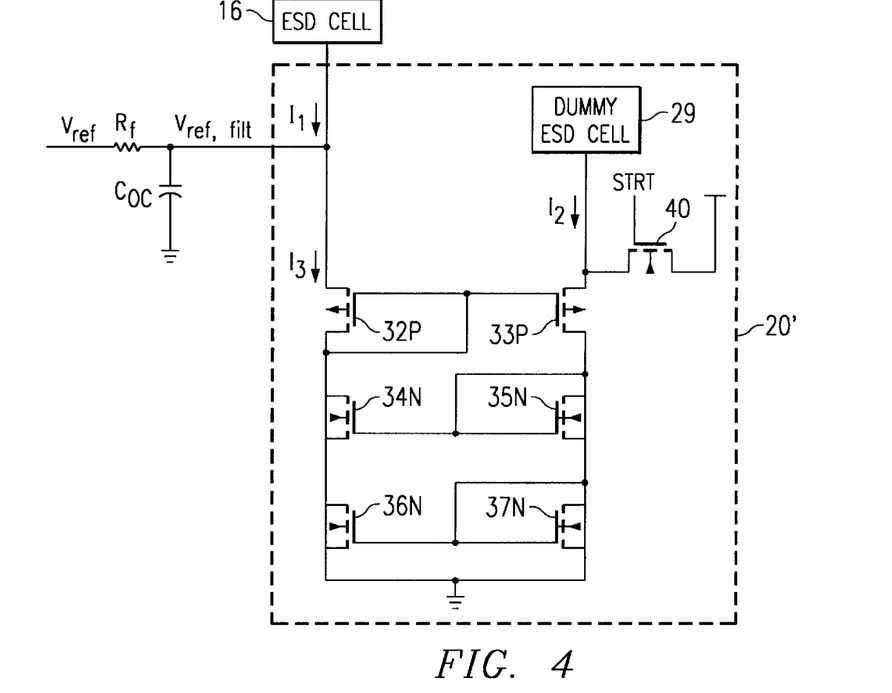
FIG. 4 is an electrical diagram of a leakage compensation circuit according to a second preferred embodiment of the invention.

Referring now to FIG. 4, ESD compensation circuit 20' according to a second preferred embodiment of the invention will now be described. According to this embodiment of the invention, ESD compensation circuit 20' compensates for leakage current that is sourced by ESD cell 16. This corresponds to the situation where reference voltage $V_{ref}$ is generated to be quite low relative to power supply voltage $V_{dd}$.

ESD compensation circuit 20' is effectively the reverse and complement of ESD compensation circuit 20 shown in FIG. 3. As before, ESD compensation circuit 20' is arranged as a current mirror with two legs, arranged in a one-to-one ratio; a first leg is connected to ESD cell 16 while the second leg is connected to dummy ESD cell 29. As in the previous case, dummy ESD cell 29 preferably matches ESD cell 16 as closely as possible, both in its physical construction and also in its layout location within integrated circuit 12.

The first current mirror leg of ESD compensation circuit 20' includes p-channel MOS transistor 32P having its source connected to ESD cell 16, at the node having the voltage $V_{ref, filt}$, and having its gate connected to its drain, both connected to the drain of n-channel MOS transistor 34N. The source of transistor 34N is in turn connected to the drain of n-channel MOS transistor 36N, which has its source biased to ground.

In the second leg, p-channel MOS transistor 33P has its source connected to dummy ESD cell 29, and has its gate connected to the gate and drain of matching p-channel transistor 32P. The drain of transistor 33P is connected to the drain and gate of n-channel MOS transistor 35N; the gate of transistor 35N is connected to the gate of matched transistor 34N in the first current mirror leg. N-channel MOS transistor 37N has its drain and gate connected to the source of transistor 35N, and to the gate of matched transistor 36N in the first current mirror leg, and has its source biased to ground.

ESD compensation circuit 20' also includes initialization device 40, which in this example is an n-channel MOS transistor having its source-drain path connected between power supply voltage $V_{dd}$ and the common drain node of transistors 33P, 35N. The gate of initialization device 40 receives a signal on line STRT from one-shot multivibrator 17 in reference voltage generator circuit 14 (FIG. 2).

The operation of ESD compensation circuit 20' is similar to that described above for ESD compensation circuit 20, but of course with opposite polarity currents. In this example, initialization device 40 is turned on by a positive polarity pulse on line STRT generated by one-shot multivibrator 17. This places a high voltage, substantially at power supply voltage $V_{dd}$, at the drain and gate of transistor 35N, turning it on. This pulls up the drain and gate of transistor 37N as well, turning this device on. Further, because transistors 34N and 36N have their gates connected in common with the gates of transistors 35N, 37N, respectively, these devices 34N, 36N in the first current mirror leg are also turned on, pulling the gate and drain of p-channel device 32P toward ground, turning on transistor 32P and thus also turning on transistor 33P.

Once the pulse on line STRT ends, turning off initialization device 40, ESD compensation circuit 20' settles into a steady-state condition in which current $I_2$ sourced by dummy ESD cell 29, and conducted through the second current mirror leg of transistors 33P, 35N, 37N, equals the current $I_3$ conducted through the first current mirror leg of transistors 32P, 34N, 36N. Additionally, p-channel transistors 32P, 33P operate to equalize the voltage at the source of transistor 33P with the filtered reference voltage $V_{ref, filt}$ appearing at the source of transistor 32P. Because ESD cell 16 and dummy ESD cell 29 are matched with one another, such that their respective leakage currents $I_1$ and $I_2$ are equal, and because the current mirror legs ensure that currents $I_2$ and $I_3$ are also equal, currents $I_1$ and $I_3$ are equalized by the operation of ESD compensation circuit 20'. Substantially no current is thus conducted through resistor $R_f$, and thus essentially no voltage drop is generated across resistor $R_f$.

This equalization continues over changes in conditions that cause the leakage currents $I_1$ and $I_3$ to modulate. Because these currents remain matched over temperature and bias, currents $I_1$ and $I_3$ will continue to match one another (after settling time), eliminating the current through, and voltage, drop across, resistor $R_f$. Filtered reference voltage $V_{ref, filt}$ thus remains stable over temperature, bias, and other conditions that cause changes in the leakage current.

In each of ESD compensation circuits 20 and 20', the number of current mirror stages may be altered, if desired. For example, the available voltage swing of the circuit could be increased by eliminating one of the current mirror stages, at a cost of loss of accuracy in the compensation. It is contemplated that those skilled in the art having reference to this specification will be readily able to realize ESD compensation circuits 20, 20' in the manner appropriate for each particular application.

Figure 5:
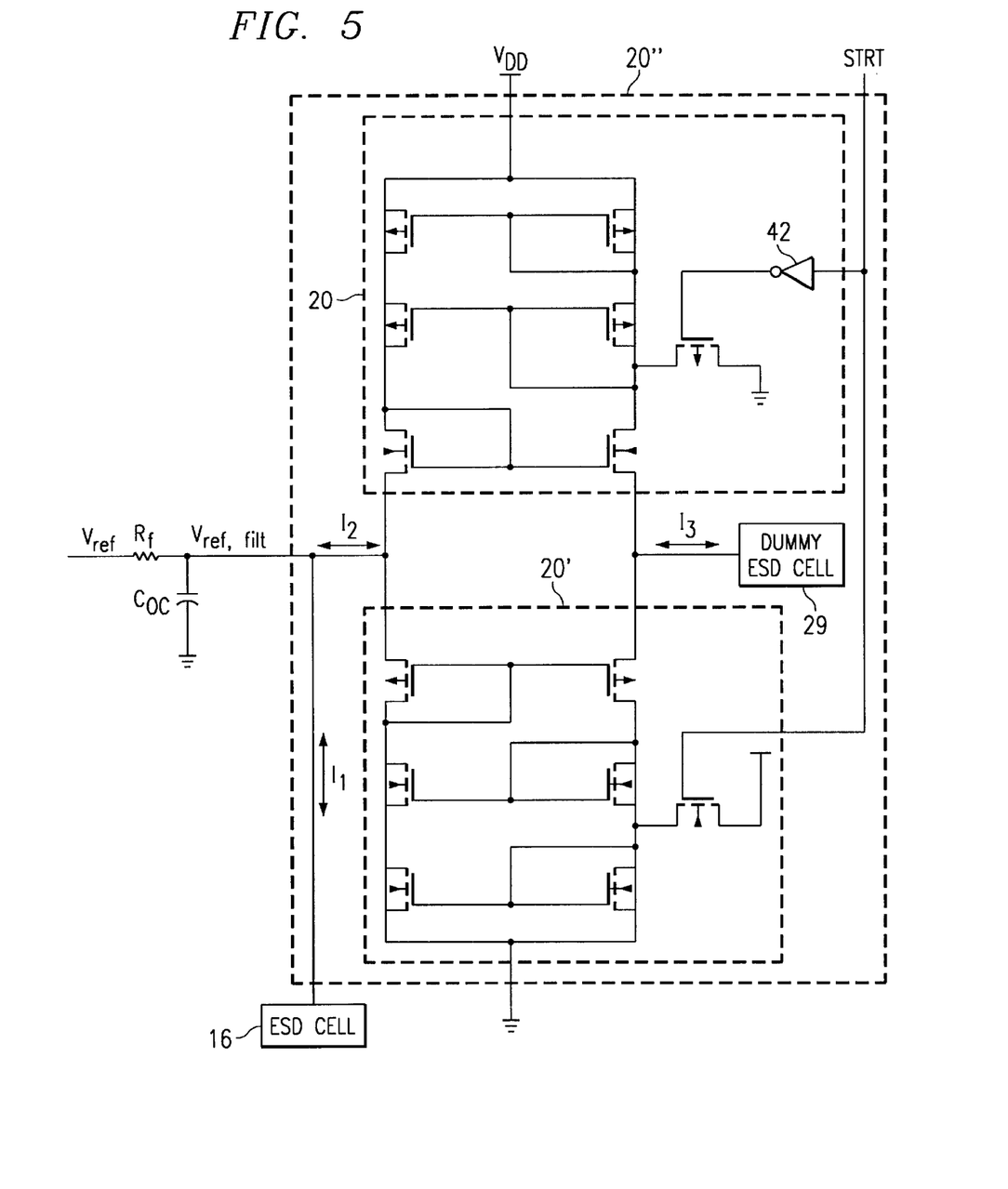
FIG. 5 is an electrical diagram of a leakage compensation circuit according to a third preferred embodiment of the invention.

Referring now to FIG. 5, ESD compensation circuit 20" according to a third preferred embodiment of the invention will be described. ESD compensation circuit 20' is suited for those situation in which the polarity of leakage through ESD cell 16 is unknown, for example where reference voltage generation circuit 14 is capable of generating a reference voltage $V_{ref}$ that may vary quite widely.

As shown in FIG. 5, ESD compensation circuit 20" includes dummy ESD cell 29, similarly as in the case of ESD compensation circuits 20, 20' described above. However, to compensate for leakage of either polarity, ESD compensation circuit 20" has both of ESD compensation circuits 20, 20', connected in common to one another at the nodes connected to ESD cell 16 and to dummy ESD cell 29. In this manner, in the event that ESD cell 16 (and dummy ESD cell 29) sink leakage current to ground, ESD compensation circuit 20 that is biased to power supply voltage $V_{dd}$ will be operable to balance the currents and voltages, and prevent leakage current from being conducted through resistor $R_f$. In the event that ESD cell 16 (and dummy ESD cell 29) source leakage current from power supply voltage $V_{dd}$, ESD compensation circuit 20' is operable to balance the currents and voltages so that current is not conduced by resistor $R_f$. In each case, the opposing ESD compensation circuit 20, 20' that is not operable for the particular leakage polarity is simply not conductive, and does not affect circuit operation.

Initialization of ESD compensation circuits 20, 20' is effected in the same manner as described above. In this example, however, so that only a single one-shot multivibrator 17 is required, inverter 42 inverts the logic state of the signal on line STRT from one-shot 17 prior to its application to transistor 30 in ESD compensation circuit 20. In operation, therefore, upon power-up or reset of integrated circuit 12, both of ESD compensation circuits 20, 20' in this embodiment of the present invention are simultaneously initialized. The selection of which of ESD compensation circuits 20, 20' actually does conduct depends simply on the direction of leakage currents $I_1$, $I_3$, as the operative one of these currents will "flip" the state of ESD compensation circuit 20" accordingly, by activating the opposing current mirror.

According to this third preferred embodiment of the invention, therefore, a wide range of reference voltage $V_{ref}$ levels can therefore be handled by ESD compensation circuit 20".

Figure 6:
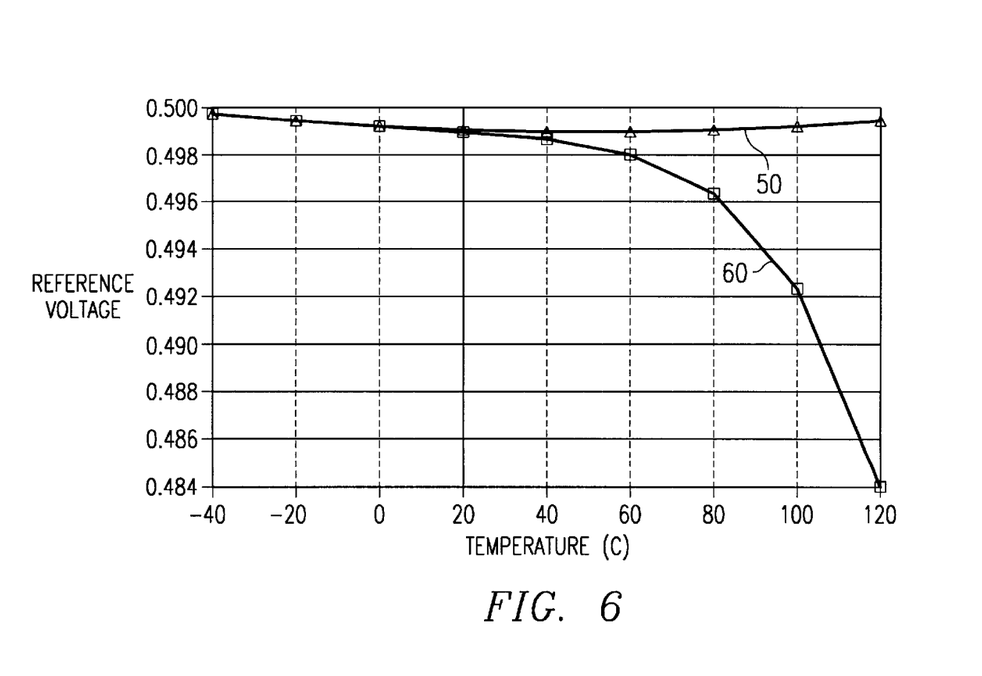
FIG. 6 is a plot of reference voltage over temperature illustrating the effect of the present invention.

Referring now to FIG. 6, the results of a SPICE simulation of the performance of ESD simulation circuit 20 according to the first preferred embodiment of the invention, over a wide range of temperature, are illustrated. Curve 50 illustrates the stability of filtered reference voltage. $V_{ref,\,filt}$, which is nominally 0.5 volts, over a temperature range of −40° C. to 120° C., when compensated by ESD simulation circuit 20. According to this simulation, filtered reference voltage $V_{ref,\,filt}$ is stable within about 1 mV over this 160° C. temperature range. This performance effectively corresponds to the simulated stability of reference voltage generator circuit 14 itself, when realized as a bandgap reference circuit of conventional design.

In contrast, the effects of filtered reference voltage $V_{ref,\,filt}$ over this temperature range, in the absence of ESD simulation circuit 20 (i.e., according to the realization of FIG. 1), are illustrated by curve 60 of FIG. 6. As evident from curve 60, the increased leakage current through the ESD cell with increasing temperature is directly reflected by the voltage drop in filtered reference voltage $V_{ref,\,filt}$, with up to on the order of 16 mV of modulation observed from the simulation.

As substantiated by this simulation, therefore, the implementation of the ESD compensation circuit according to the preferred embodiments of the invention provides greatly improved stability in the filtered reference voltage. This improved stability enables the analog or mixed-signal circuits that rely upon reference voltage $V_{ref}$ to operate with a higher level of precision than in conventional integrated circuits. This improved stability and precision is obtained with minimal circuit cost, and with only a very slight increase in power dissipation (i.e., doubling of the ESD cell leakage current of about 80 nA).

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. An integrated circuit, comprising:
   a reference voltage generator circuit, for generating a reference voltage;
   functional circuitry, for performing a circuit function responsive to a voltage corresponding to the reference voltage;
   a series resistor connected between the reference voltage generator circuit and an external terminal;
   an ESD protection circuit, connected to the external terminal; and
   an ESD compensation circuit, connected to the external terminal, and coupled to receive an initialization signal from said reference voltage generator circuit, comprising:
      a dummy ESD cell, constructed to match the characteristics of the ESD protection circuit; and
      a first current mirror, having a first leg connected between a first voltage and the ESD protection circuit, and having a second leg connected between the first voltage and the dummy ESD cell, the first and second legs of the first current mirror arranged to conduct equivalent currents.

2. An integrated circuit, comprising:
   a reference voltage generator circuit, for generating a reference voltage;
   functional circuitry, for performing a circuit function responsive to a voltage corresponding to the reference voltage;
   a series resistor connected between the reference voltage generator circuit and an external terminal;
   an ESD protection circuit, connected to the external terminal; and
   an ESD compensation circuit, connected to the external terminal, and comprising:
      a dummy ESD cell, constructed to match the characteristics of the ESD protection circuit; and
      a first current mirror, having a first leg connected between a first voltage and the ESD protection circuit, and having a second leg connected between the first voltage and the dummy ESD cell, the first and second legs of the first current mirror arranged to conduct equivalent currents, the first current mirror comprises:
         a first MOS transistor of a first conductivity type, having a source-drain path connected on one end to the first voltage, and having a gate;
         a second MOS transistor of a second conductivity type, having a source-drain path coupled on one end to the source-drain path of the first MOS transistor in the first leg of the first current mirror, and coupled on another end to the ESD protection circuit, and having a gate connected to its drain;
         a third MOS transistor of the first conductivity type, having a source-drain path connected on one end to the first voltage, and having a gate connected to the gate of the first MOS transistor; and
         a fourth MOS transistor of the second conductivity type, having a source-drain path coupled on one end to the source-drain path of the third MOS transistor in the second leg of the first current mirror, and coupled on another end to the dummy ESD cell, and having a gate connected to the gate of the second MOS transistor.

3. The integrated circuit of claim 2, wherein the first current mirror further comprises:
   a first initialization device, for initializing conduction in transistors in the second leg of the first current mirror.

4. The integrated circuit of claim 3, further comprising:
   a one-shot multivibrator, coupled to the first initialization device, for generating a control pulse, responsive to startup of the integrated circuit, that turns on the first initialization device for the selected duration.

5. The integrated circuit of claim 2, wherein the first current mirror further comprises:
   a fifth MOS transistor of the first conductivity type, having a source-drain path connected in series with the first and second MOS transistors in the first leg, and having a gate;
   a sixth MOS transistor of the first conductivity type, having a source-drain path connected in series with the third and fourth MOS transistors in the second leg, and having a gate connected to the gate of the fifth MOS transistor.

6. The integrated circuit of claim 5, wherein the first current mirror further comprises:
   a first initialization device, for turning on the sixth transistor in the second leg of the first current mirror.

7. The integrated circuit of claim 6, further comprising:
a one-shot multivibrator, coupled to the first initialization device, for generating a control pulse, responsive to startup of the integrated circuit, that turns on the first initialization device for a selected duration.

8. The integrated circuit of claim 1, wherein the functional circuitry comprises circuitry for performing an analog function.

9. The integrated circuit of claim 1, further comprising:
a capacitor connected to the external terminal, for filtering, in combination with the series resistor, the reference voltage generated by the reference voltage generator circuit.

10. The integrated circuit of claim 1, wherein the ESD compensation circuit further comprises:
a second current mirror, having a first leg connected between a second voltage and the ESD protection circuit, and having a second leg connected between the first voltage and the dummy ESD cell, the first and second legs of the second current mirror arranged to conduct equivalent currents.

11. The integrated circuit of claim 10, wherein the first current mirror comprises:
a first MOS transistor of a first conductivity type, having a source-drain path connected on one end to the first voltage, and having a gate;
a second MOS transistor of a second conductivity type, having a source-drain path coupled on one end to the source-drain path of the first MOS transistor in the first leg of the first current mirror, and coupled on another end to the ESD protection circuit, and having a gate connected to its drain;
a third MOS transistor of the first conductivity type, having a source-drain path connected on one end to the first voltage, and having a gate connected to the gate of the first MOS transistor in the first leg of the first current mirror; and
a fourth MOS transistor of the second conductivity type, having a source-drain path coupled on one end to the source-drain path of the third MOS transistor in the second leg of the first current mirror, and coupled on another end to the dummy ESD cell, and having a gate connected to the gate of the second MOS transistor, and wherein the second current mirror comprises:
a first MOS transistor of the first conductivity type, having a source-drain path connected on one end to the second voltage, and having a gate;
a second MOS transistor of the second conductivity type, having a source-drain path coupled on one end to the source-drain path of the first MOS transistor in the first leg of the second current mirror, and coupled on another end to the ESD protection circuit, and having a gate connected to its drain;
a third MOS transistor of the first conductivity type, having a source-drain path connected on one end to the second voltage, and having a gate connected to the gate of the first MOS transistor in the first leg of the second current mirror; and
a fourth MOS transistor of the second conductivity type, having a source-drain path coupled on one end to the source-drain path of the third MOS transistor in the second leg of the second current mirror, and coupled on another end to the dummy ESD cell, and having a gate connected to the gate of the second MOS transistor in the first leg of the second current mirror.

12. The integrated circuit of claim 11, wherein the first current mirror further comprises:
a first initialization device, for initializing conduction in transistors in the second leg of the first current mirror;
wherein the second current mirror further comprises:
a second initialization device, for initializing conduction in transistors in the second leg of the second current mirror, and further comprising:
a one-shot multivibrator, coupled to the first and second initialization device, for generating a control pulse, responsive to startup of the integrated circuit, that turns on the first and second initialization devices for a selected duration.

13. A method of generating a filtered reference voltage for use in an integrated circuit, comprising:
generating a reference voltage for use by functional circuitry;
generating an initialization signal for use by an ESD compensation circuit;
applying the reference voltage to a low-pass filter comprised of a series resistor and an off-chip capacitor, having a node therebetween at an external terminal of the integrated circuit, at which an ESD cell is connected for the protection of the functional circuitry from electrostatic discharge energy;
applying the initialization signal to the ESD compensation circuit; and
balancing leakage current drawn by the ESD cell at the external terminal by conducting current through a second leg of a current mirror, the second leg of the current mirror connected to a dummy ESD cell, within said ESD compensation circuit, having matched characteristics with the ESD cell, and symmetrically biased with a first leg of the current mirror that is connected to the ESD cell.

14. A method of generating a filtered reference voltage for use in an integrated circuit, comprising:
generating a reference voltage for use by functional circuitry;
applying the reference voltage to a low-pass filter comprised of a series resistor and an off-chip capacitor, having a node therebetween at an external terminal of the integrated circuit, at which an ESD cell is connected for the protection of the functional circuitry from electrostatic discharge energy;
balancing leakage current drawn by the ESD cell at the external terminal by conducting current through a second leg of a current mirror, the second leg of the current mirror connected to a dummy ESD cell having matched characteristics with the ESD cell, and symmetrically biased with a first leg of the current mirror that is connected to the ESD cell; and
initializing conduction in the second leg of the current mirror upon startup of the integrated circuit.

15. A method of generating a filtered reference voltage for use in an integrated circuit, comprising:
generating a reference voltage for use by functional circuitry;
applying the reference voltage to a low-pass filter comprised of a series resistor and an off-chip capacitor, having a node therebetween at an external terminal of the integrated circuit, at which an ESD cell is connected for the protection of the functional circuitry from electrostatic discharge energy; and balancing leakage current drawn by the ESD cell at the external terminal by conducting current through a second leg of a current mirror, the second leg of the current mirror connected to a dummy ESD cell having matched characteristics with the ESD cell, and symmetrically biased with a first leg of the current mirror that is connected to the ESD cell wherein the integrated circuit includes first and second current mirrors, each having a first leg connected to the ESD cell and a second leg connected to the dummy ESD cell, the first and second current mirrors biased by first and second voltages, respectively; and wherein the balancing step utilizes a selected one of the first and second current mirrors responsive to the polarity of the leakage current drawn by the ESD cell.

16. The method of claim 15, further comprising:
  initializing conduction in the second leg of the first and second current mirrors upon startup of the integrated circuit.

17. The integrated circuit of claim 1, wherein the initialization signal is a negative-going pulse.

18. The integrated circuit of claim 1, wherein the initialization signal is a positive-going pulse.

19. The integrated circuit of claim 1, wherein the initialization signal is generated by a one-shot multivibrator.

20. The integrated circuit of claim 19, wherein the multivibrator issues the initialization signal responsive to startup of the integrated circuit.

* * * * *